United States Patent

Iwasaki et al.

Patent Number: 4,661,434

Date of Patent: Apr. 28, 1987

[54] PHOTOPOLYMERIZABLE COMPOSITION CONTAINING A NOVEL COMBINATION OF PHOTOPOLYMERIZABLE INITIATORS

[75] Inventors: Masayuki Iwasaki; Minoru Maeda; Fumiaki Shinozaki, all of Shizuoka, Japan

[73] Assignee: Fuji Photo Film Co., Ltd., Kanagawa, Japan

[21] Appl. No.: 641,151

[22] Filed: Aug. 16, 1984

[30] Foreign Application Priority Data

Aug. 16, 1983 [JP] Japan .................. 58-149335

[51] Int. Cl.[4] .............................. G03C 1/68
[52] U.S. Cl. .................. 430/281; 430/288; 430/920; 430/921; 430/922; 430/923; 430/926; 430/925; 430/919; 522/26; 522/8; 522/59; 522/17
[58] Field of Search ............ 430/281, 920, 921, 922, 430/923, 926, 925, 919, 288; 204/159.23, 159.24; 522/26, 8, 59, 17

[56] References Cited

U.S. PATENT DOCUMENTS

| | | | |
|---|---|---|---|
| 3,427,161 | 2/1969 | Laridon et al. | 204/159.23 |
| 3,759,807 | 9/1973 | Osborn et al. | 204/159.13 X |
| 3,926,643 | 12/1975 | Chang | 430/281 X |
| 4,113,592 | 9/1978 | Rybny et al. | 430/281 X |
| 4,232,106 | 11/1980 | Iwasaki et al. | 430/281 X |
| 4,258,123 | 3/1981 | Nagashima et al. | 430/281 |
| 4,279,982 | 7/1981 | Iwasaki et al. | 430/281 X |
| 4,454,219 | 6/1984 | Yamadera et al. | 430/281 |

Primary Examiner—John E. Kittle
Assistant Examiner—Cynthia Hamilton
Attorney, Agent, or Firm—Sughrue, Mion, Zinn, Macpeak, and Seas

[57] ABSTRACT

A photopolymerizable composition comprising (A) an addition-polymerizable unsaturated compound having two or more ethylenically unsaturated double bonds and (B) a ternary photopolymerization initiator system, comprising a combination of a 4,4'-bis(dialkylamino)-benzophenone represented by the following general formula (I), a carbonyl compound represented by the following general formula (IIa) or (IIb), and a compound having a group represented by the following general formula (III):

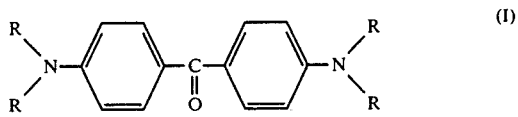

wherein each R, which may be the same or different, represents an alkyl group, a cycloalkyl group or a hydroxyalkyl group, or may be bonded to another R substituent of the same nitrogen atom to form a tetramethylene group, a pentamethylene group or an oxybisethylene group;

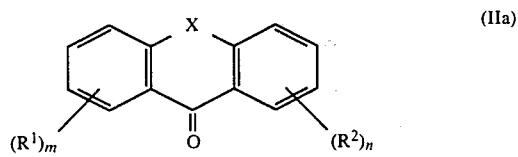

wherein X represents a single bond, an oxygen atom, a sulfur atom, a substituted or unsubstituted nitrogen atom or a carbonyl group, $R^1$ and $R^2$, which may be the same or different, each represents an alkyl group, an alkoxy group, a carboxy group, an alkoxycarbonyl group, an aryloxycarbonyl group, or a halogen atom, and m and n each represents an integer of 0 to 3;

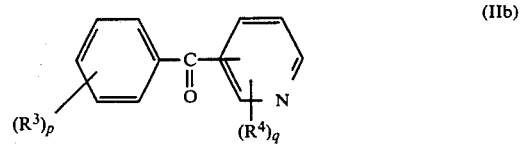

wherein $R^3$ and $R^4$, which may be the same or different, each represents an alkyl group, an alkoxy group, a carboxy group, an alkoxycarbonyl group, an aryloxycarbonyl group, a cyano group or a halogen atom, p represents an integer of 0 to 5, and q represents an integer of 0 to 4; and $$-CY_3 \qquad (III)$$

wherein Y represents a halogen atom.

7 Claims, No Drawings

PHOTOPOLYMERIZABLE COMPOSITION CONTAINING A NOVEL COMBINATION OF PHOTOPOLYMERIZABLE INITIATORS

FIELD OF THE INVENTION

This invention relates to a photopolymerizable composition containing a novel combination of photopolymerization initiators. More particularly, it relates to a photopolymerizable composition having high sensitivity and providing a photo-hardenable film of excellent film strength, suitable for preparing lithographic printing plates, resinous letterpresses, and resists or photomasks for printed-wiring boards.

BACKGROUND OF THE INVENTION

A photopolymerizable composition fundamentally comprises a photopolymerization initiator and a polyfunctional monomer, that is hardened upon being irradiated with light to become insoluble in solvents. Such compositions are widely utilized in photography, printing, surface processing of metals, inks, etc. (see J. Kosar, *Light-Sensitive Systems*, 158–193 (J. Wiley & Sons, New York, 1965)).

Studies on photopolymerizable compositions have been made to enhance their sensitivity to light, and many photopolymerization initiators have been proposed to achieve the end; for example, benzoin ethers described in U.S. Pat. No. 2,448,828, benzoins described in U.S. Pat. No. 2,722,512, anthraquinones described in U.S. Pat. No. 3,046,127, aminophenylketones and active methyl or amino compounds described in Japanese Patent Publication No. 11936/74 (corresponding to U.S. Pat. No. 3,661,588), Michler's ketone and benzophenone described in U.S. Pat. No. 3,682,641, and benzophenone and 4-N,N-dimethylaminobenzophenone described in Japanese Patent Publication No. 38403/73 (U.S. Pat. No. 3,549,367). These photopolymerization initiators improve photosensitivity to some extent, but the resulting photo-hardened products (particularly film-like hardened products) have mechanical properties that may be insufficient for various end uses.

For example, when used as dry film resist in preparation of printed-wiring boards, they provide insufficient film strength after photo-hardening. Japanese Patent Publication No. 25231/70 describes dry film resists for preparing printed-wiring boards, and more detailed descriptions are given in, for example, W. S. De Forest, *Photoresist*, 163–212 (McGraw-Hill, New York, 1975). The main use of dry film resists is for preparation of perforations by tenting. However, conventionally known photopolymerization initiators have the disadvantage that due to insufficient strength of the tenting film, film breakage occurs in developing and etching steps.

SUMMARY OF THE INVENTION

An object of the present invention is to provide a photopolymerizable composition which forms a photohardened film having excellent strength.

Another object of the present invention is to provide a photopolymerizable composition having high photosensitivity.

Other objects of the present invention will become apparent from the following description of the present invention.

These and other objects of the invention have now been attained by a photopolymerizable composition containing a novel combination of photopolymerization initiators, and specifically, a photopolymerizable composition comprising (A) an addition-polymerizable unsaturated compound (polyfunctional monomer) having two or more ethylenically unsaturated double bonds within its molecule and (B) a ternary photopolymerization initiator system, which contains as the initiator a combination of a 4,4'-bis(dialkylamino)benzophenone represented by the following general formula (I), a carbonyl compound represented by the following general formula (IIa) or (IIb), and a compound having a group represented by the following general formula (III):

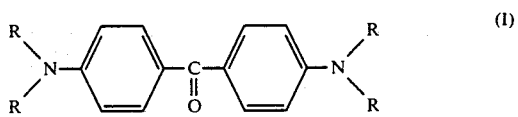

wherein each R, which may be the same or different, represents an alkyl group (preferably having 1 to 6 carbon atoms), a cycloalkyl group (preferably having 5 or 6 carbon atoms) or a hydroxyalkyl grop (preferably having 2 to 6 carbon atoms), or may be bonded to another R substituent of the same nitrogen atom to form a tetramethylene group, a pentamethylene group or an oxybisethylene group;

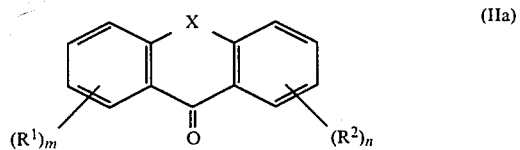

wherein X represents a single bond, an oxygen atom, a sulfur atom, a substituted or unsubstituted nitrogen atom (a preferred substituent is a methyl group) or a carbonyl group, $R^1$ and $R^2$, which may be the same or different, each represents an alkyo group (preferably having 1 to 3 carbon atoms), an alkoxy group (preferably having 1 to 3 carbon atoms), a carboxy group, an alkoxycarbonyl group (preferably having 2 to 21 carbon atoms), an aryloxycarbonyl group (preferably having 7 to 21 carbon atoms), or a halogen atom (e.g., a chlorine or bromine atom), and m and n each represents an integer of 0 to 3;

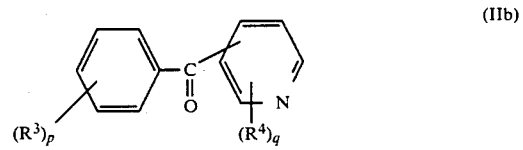

wherein $R^3$ and $R^4$, which may be the same or different, each represents an alkyl group (preferably having 1 to 3 carbon atoms), an alkoxy group (preferably having 1 to 3 carbon atoms), a carboxy group, an alkoxycarbonyl group (preferably having 2 to 21 carbon atoms), an aryloxycarbonyl group (preferably having 7 to 21 carbon atoms), a cyano group or a halogen atom (e.g., a chlorine or bromine atom), p represents an integer of 0 to 5, and q represents an integer of 0 to 4; and

wherein Y represents a halogen atom (e.g., a chlorine or bromine atom).

DETAILED DESCRIPTION OF THE INVENTION

Specific preferred examples of the compounds of general formula (I) used in the present invention include 4,4'-bis(dimethylamino)benzophenone, 4,4'-bis(dicyclohexylamino)benzophenone, 4,4'-bis(diethylamino)-benzophenone, 4,4'-bis(dihydroxyethylamino)benzophenone, 4,4'-bis(morpholino)benzophenone, etc. Particularly preferred compounds include 4,4'-bis(dimethylamino)benzophenone and 4,4'-bis(diethylamino)benzophenone.

Specific examples of the compounds of general formula (IIa) include fluorenone, xanthone, thioxanthone, 2-chlorothioxanthone, 2,4-dimethylthioxanthone, 2,4-diethylthioxanthone, N-methylacridone, 2-t-butylanthraquinone, 2-methylanthraquinone, 2-chloroanthraquinone, etc., with xanthone, fluorenone, and 2,4-diethylthioxanthone being particularly preferred.

Specific examples of the compounds of general formula (IIb) include 2-benzoylpyridine, 3-benzoylpyridine, and 4-benzoylpyridine, with 4-benzoylpyridine being particularly preferred.

As the compounds having a group of general formula (III), those selected from among compounds represented by the following general formulae (IIIa) to (IIIe) are preferred:

(IIIa)

wherein $Ar^1$ represents a substituted or unsubstituted phenyl or naphthyl group, and Z represents a chlorine or bromine atom;

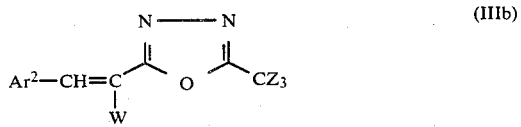
(IIIb)

wherein $Ar^2$ represents a substituted or unsubstituted phenyl or naphthyl group, W represents a hydrogen atom, an alkyl group (preferably having 1 to 6 carbon atoms) or an aryl group (preferably having 6 to 20 carbon atoms), and Z represents a chlorine atom or a bromine atom;

$Ar^3$—$SO_2CZ_3$ (IIIc)

wherein $Ar^3$ represents a substituted or unsubstituted phenyl or naphthyl group, and Z represents a chlorine atom or a bromine atom;

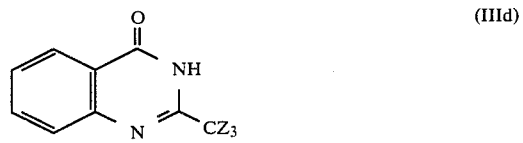
(IIId)

wherein Z represents a chlorine or bromine atom; and

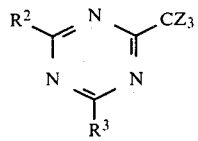
(IIIe)

wherein $R^2$ represents $CZ_3$, or a substituted or unsubstituted phenyl or naphthyl group; $R^3$ represents $CZ_3$, $NH_2$, $NHR^4$, $N(R^4)_2$, $SR^4$, $OR^4$ or $R^4$; $R^4$ represents an alkyl group (preferably having 1 to 6 carbon atoms), an aryl group (preferably having 6 to 20 carbon atoms), or an alkenyl group (preferably having 2 to 6 carbon atoms); and Z represents a chlorine atom or a bromine atom.

Examples of substituents on the phenyl group or the naphthyl group represented by $Ar^1$ in general formula (IIIa) include a halogen atom, an alkyl group having 1 to 6 carbon atoms, an alkoxy group having 1 to 6 carbon atoms, a nitro group, a cyano group and a methylenedioxy group.

Examples of substituents on the phenyl group or the naphthyl group represented by $Ar^2$ in general formula (IIIb) include a halogen atom, an alkyl group having 1 to 6 carbon atoms, an alkoxy group having 1 to 6 carbon atoms, a phenoxy group, an acetoxy group, a nitro group, a cyano group and a phenyl group.

Examples of substituents on the phenyl group or the naphthyl group represented by $Ar^3$ in general formula (IIIc) include a halogen atom, an alkyl group having 1 to 6 carbon atoms, an alkoxy group having 1 to 6 carbon atoms and a nitro group.

Examples of substituents on the phenyl group or the naphthyl group represented by $R^2$ in general formula (IIIe) include a halogen atom, an alkyl group having 1 to 6 carbon atoms and an alkoxy group having 1 to 6 carbon atoms.

The compounds of general formula (IIIa) are described in Japanese Patent Application (OPI) No. 77742/80 (U.S. Pat. No. 4,279,982) (the term "OPI" as used herein refers to a "published unexamined Japanese patent application"), and preferred examples thereof include 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, etc., with 2-trichloromethyl-5-(1-naphthyl)-1,3,4-oxadiazole and 2-trichloromethyl-5-(4-chlorophenyl)-1,3,4-oxadiazole being particularly preferred.

The compounds represented by general formula (IIIb) are described in Japanese Patent Application (OPI) No. 74728/79 (U.S. Pat. No. 4,232,106), and preferred examples thereof include 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, 2-tribromomethyl-5-styryl-1,3,4-oxadiazole, etc., with 2-trichloromethyl-5-(4-chlorostyryl)-1,3,4-oxadiazole and 2-trichloromethyl-5-(4-n-butoxystyryl)-1,3,4-oxadiazole being particularly preferred.

Examples of the compounds represented by general formula (IIIc) include phenyltribromomethylsulfone, p-nitrophenyltribromomethylsulfone, p-chlorophenyltribromomethylsulfone, etc., with phenyltribromomethylsulfone being particularly preferred.

Examples of the compounds of general formula (IIId) include 2-trichloromethylquinazoline and 2-tribromomethylquinazoline, with 2-trichloromethylquinazoline being particularly preferred.

The compounds represented by general formula (IIIe) are described in Japanese Patent Application (OPI) No. 74887/79 (U.S. Pat. No. 4,239,850), and examples thereof include 2,4,6-tris(trichloromethyl)-s-triazine, 2-phenyl-4,6-bis(trichloromethyl)-s-triazine, 2-(4-methoxyphenyl)-4,6-bis(trichloromethyl)-s-triazine, 2-(4-chlorophenyl)-4,6-bis(tribromomethyl)-s-triazine, etc., with 2,4,6-tris(trichloromethyl)-s-triazine and 2-(4-methoxyphenyl)-4,6-bis(trichloromethyl)-s-triazine being particularly preferred.

Preferred examples of the ternary photopolymerization initiator system of the present invention are as follows:

| Compound Represented by Formula (I) | Compound Represented by Formula (IIa) or (IIb) | Compound Represented by Formula (III) |
| --- | --- | --- |
| 4,4'-bis(diethylamino)-benzophenone | 4-benzoylpyridine | 2-trichloromethyl-5-(1-naphthyl)-1,3,4-oxadiazole |
| 4,4'-bis(diethylamino)-benzophenone | " | 2-trichloromethyl-5-(4-chlorophenyl)-1,3,4-oxadiazole |
| 4,4'-bis(diethylamino)-benzophenone | " | 2-trichloromethyl-5-(4-chlorostyryl)-1,3,4-oxadiazole |
| 4,4'-bis(diethylamino)-benzophenone | " | 2,4,6-tris(trichloromethyl)-s-triazine |
| 4,4'-bis(diethylamino)-benzophenone | " | 2-trichloromethylquinazoline |
| 4,4'-bis(diethylamino)-benzophenone | 2,4-dimethylthioxanthone | phenyltribromomethylsulfone |
| 4,4'-bis(diethylamino)-benzophenone | " | 2,4,6-tris(trichloromethyl)-s-triazine |
| 4,4'-bis(diethylamino)-benzophenone | 4-benzoylpyridine | phenyltribromomethylsulfone |
| 4,4'-bis(diethylamino)-benzophenone | " | 2-trichloromethyl-5-(4-chlorophenyl)-1,3,4-oxadiazole |

Typical examples of preferred polyfunctional monomers to be used in the photopolymerizable composition of the invention are as follows: acrylic or methacrylic esters of polyols, such as diethylene glycol diacrylate or dimethacrylate, triethylene glycol diacrylate or dimethacrylate, tetraethylene glycol diacrylate or dimethacrylate, pentaerythritol triacrylate or trimethacrylate trimethylolpropane triacrylate or trimethacrylate, dipentaerythritol hexaacrylate or hexamethacrylate, 1,6-hexanediol diacrylate or dimethacrylate, etc.; bisacrylamides or methacrylamides such as methylenebisacrylamide or methylenebismethacrylamide, ethylenebisacrylamide or ethylenebismethacrylamide, etc.; polyfunctional monomers containing a urethane group or groups, such as di(2-methacryloxyethyl)-2,4-tolylenediurethane and di(2-acryloxyethyl)hexamethylenediurethane; and acrylurethane or methacrylurethane oligomers obtained by reacting a terminal isocyanate group-containing compound (obtained by previously reacting a polyol with a diisocyanate) with a β-hydroxyalkyl acrylate or methacrylate.

These examples are described in Japanese Patent Publication Nos. 5093/60, 14719/60 and 28729/69 (British Pat. No. 1,154,872).

The photopolymerizable composition of the present invention contains the ternary photopolymerization initiator system and the polyfunctional monomer as necessary ingredients. If desired, additional components known in the art, such as a high molecular weight binder, a thermal polymerization inhibitor, a plasticizer, a dye, a color-changing agent, an ethylenically unsaturated compound other than the aforesaid polyfunctional monomer, an agent for accelerating adhesion to anodized aluminum or copper surface, and other aids may be used to prepare a wide variety of lithographic printing plates, resinous letterpresses, photoresists, photomasks, etc.

The above-described high molecular weight binders are those which are used for improving printability and physical properties of resists, and examples thereof include saturated or unsaturated, modified or non-modified alkyd or polyester resins, vinyl resins, acrylic resins, epoxy resins, xylene resins, aromatic sulfonamide-formaldehyde resins, ketone resins, petroleum resins, diallyl phthalate resins; melamine resins, rosin-modified phenol resins, natural resins (e.g., cellulose, cellulose derivatives, etc.), and the like. Particularly preferred examples thereof include alcohol-soluble nylon, poly(-methyl methacrylate), methyl methacrylate-methacrylic acid copolymer, etc.

The thermal polymerization inhibitors are added to inhibit thermal polymerization or spontaneous polymerization over a period of time of the photopolymerizable composition of the present invention, and examples thereof include p-methoxyphenol, hydroquinone, t-butylcatechol, pyrogallol, 2-hydroxybenzophenone, 4-methoxy-2-hydroxybenzophenone, cuprous chloride, phenothiazine, chloranil, napthylamine, β-naphthol, 2,6-di-t-butyl-p-cresol, nitrobenzene, dinitrobenzene, picric acid, p-toluidine, etc.

The plasticizers are added for controlling the physical properties of film, and examples thereof include phthalic acid esters (e.g., dibutyl phthalate, diheptyl phthalate, dioctyl phthalate, diallyl phthalate, etc.), glycol esters (e.g., triethylene glycol diacetate, tetraethylene glycol diacetate, etc.), phosphoric acid esters (e.g., tricresyl phosphate, triphenyl phosphate, etc.), amides (e.g., p-toluenesulfonamide, benzenesulfonamide, N-n-butylacetamide, etc.), aliphatic dibasic acid esters (e.g., diisobutyl adipate, dioctyl adipate, dimethyl sebacate, dioctyl azelate, dibutyl maleate, etc.), triethyl citrate, tributyl citrate, glycerin triacetyl ester, butyl laurate, dioctyl 4,5-diepoxycyclohexane-1,2-dicarboxylate, etc.

The dyes are exemplified by Brilliant Green, Eosine, Ethyl Violet, Erythrosine B, Methyl Green, Crystal Violet, Victoria Pure Blue BOH, Basic Fuchsine, Phenolphthalein, 1,3-diphenyltriazine, Alizarine Red S, Thymolphthalein, Methyl Violet 2B, Quinaldine Red, Rose Bengale, Metanil Yellow, Thymolsulfophthalein, Xylenol Blue, Methyl Orange, Orange IV, diphenylthiocarbazone, 2,7-dichlorofluorescein, Paramethyl Red, Congo Red, Benzopurpurin 4B, α-Naphthyl Red, Nile Blue A, phenacetaline, Methyl Violet, Malachite Green, Parafuchsine, Oil Blue #603 (made by Orient Kagaku Kogyo K.K.), Rhodamine B, Rhodamine 6G, etc.

The color-changing agents are added to the photopolymerizable composition so as to provide a visible image upon exposure. Specific examples thereof include diphenylamine, dibenzylaniline, triphenylamine, diethylaniline, diphenyl-p-phenylenediamine, p-toluidine, 4,4'-biphenyldiamine, o-chloroaniline, p,p',p''-hexamethyltriaminotriphenylmethane, p,p'-tetramethyldiaminotriphenylmethane, p,p',p''-triaminotriphenylcarbinol, etc., in addition to the aforesaid dyes.

Specific examples of the ethylenically unsaturated compounds other than the foregoing polyfunctional monomers include ethylene glycol monoacrylate or monomethacrylate, triethylene glycol methyl ether acrylate or methacrylate, ethylene glycol phenyl ether acrylate or methacrylate, tetraethylene glycol monoacrylate or monomethacrylate, diacetoneacrylamide, acrylamide, methacrylamide, N-n-butylacrylamide or methacrylamide, etc.

Specific examples of the adhesion-accelerating agents include those described in Japanese Patent Publication No. 9177/75 (U.S. Pat. No. 3,645,772), such as benzimidazole, benzothiazole, benzoxazole, benzotriazole, etc., and those described in Japanese Patent Application (OPI) No. 702/78, such as 2-mercaptobenzothiazole, 2-mercaptobenzimidazole, etc.

Preferred proportions and particularly preferred proportions of the foregoing constituents are given below based on 100 parts by weight of the polyfunctional monomer.

|  | Preferred Range | Particularly Preferred Range |
|---|---|---|
| Compound (I) | 0.01–100 | (0.1–50) |
| Compound (IIa) or (IIb) | 0.01–100 | (0.1–50) |
| Compound (III) | 0.01–100 | (0.1–50) |
| High molecular weight binder | 0–10,000 | (0–1,000) |
| Thermal polymerization inhibitor | 0–50 | (0–20) |
| Plasticizer | 0–1,000 | (0–100) |
| Dye | 0–100 | (0–50) |
| Color-changing agent | 0–100 | (0–50) |
| Ethylenically unsaturated compound | 0–1,000 | (0–100) |
| Adhesion-accelerating agent | 0–50 | (0–20) |

The photopolymerizable composition of the present invention is prepared by dissolving the aforesaid constituents in a proper solvent and coating the resulting solution on a desired support in a known manner. The solvent selected is not unduly limited, and may be freely selected from those known in the art. As the solvent, ethylene dichloride, monochlorobenzene, cyclohexanone, methyl ethyl ketone, acetone, methyl cellosolve acetate, ethyl acetate, methyl acetate, methyl cellosolve, toluene, xylene, etc., may be used alone or in combination.

The photopolymerizable composition of the present invention may be advantageously used as a photoresist layer of a dry film resist. When used as the photoresist layer, the composition is coated in a thickness of about 0.1μ to 500μ, particularly preferably about 1μ to 200μ. In the case of using the photopolymerizable composition of the present invention to prepare presensitized lithographic plates, the composition is applied to form a coating when dry in an amount of about 0.1 to 10.0 g/m² and, particularly preferably, about 0.5 to 5.0 g/m².

The support selected is not unduly limited, and may be freely selected from a wide variety of supports known in the art depending on the intended use of the resulting light-sensitive material.

In using the photopolymerizable composition of the present invention as a dry film resist, preferred supports are selected from among polyamides, polyolefins, polyesters, vinyl polymers, cellulose esters, etc., of about 3μ to 100μ in thickness. Particularly preferred supports are transparent polyethylene terephthalate films of about 25μ in thickness. In addition, a suitable protective film may also be used, such as a polyolefinic film of preferably about 20 to 25μ in thickness.

In using the photopolymerizable composition of the present invention for producing films for photomasks, a polyethylene terephthalate film having vacuum-deposited thereon aluminum, aluminum alloy or chromium, and polyethylene terephthalate films having provided thereon a colored layer are suitably used as supports.

When the photopolymerizable composition of the present invention is used in a light-sensitive layer of a presensitized lithographic plate, suitable supports include aluminum plates which are rendered hydrophilic, such as silicate-treated aluminum plates, anodized aluminum plates, grained aluminum plates, and silicate-electrodeposited aluminum plates and, in addition, zinc plates, stainless steel plates, chromium-treated copper plates, and plastic film or paper which are rendered hydrophilic.

As supports used when the photopolymerizable composition of the present invention is used for producing color proofs for printing, films for overhead projectors, or films for preparing second originals, typical examples include transparent films such as polyethylene terephthalate film, cellulose triacetate film, etc., and chemically or physically surface-matted films thereof.

The ternary photopolymerization initiator system of the present invention shows a surprisingly enhanced sensitivity and high photo-hardened film strength. As a result, when used as dry film resist, the composition of the present invention provides a "tent" having remarkably enhanced spray impact resistance, thus improving the reliability of the "tent". When used for making lithographic printing plates, printing life is remarkably improved, thus reducing plate-making costs. Further, when used as a light-sensitive layer for photomask or color proof, it provides an enhanced image, providing prolonged photomask or color proof life. In addition, the resulting film of high strength is remarkably durable and does not require excessive care in handling, leading to improved working efficiency.

Excellent development characteristics of the photopolymerizable composition of the present invention prevent the formation of scums and printing stains.

Dry film resists or light-sensitive materials such as presensitized plates or color proofs using the photopolymerizable composition of the present invention have a good storage life due to the good stability of the composition.

The ternary photopolymerization initiator system of the present invention also has a high ability to change the color of a leuco dye or other dye included in the composition with light, and hence can impart print-out properties to the photoresist or presensitized lithographic plate.

The present invention will now be described in more detail by reference to examples of preferred embodiments of the present invention which, however, are not to be construed as limiting the present invention in any way. Unless otherwise indicated herein, all percents, parts and ratios are by weight.

EXAMPLE 1

The following coating solutions containing the various photopolymerizable initiators shown in Table 1 and other common components shown were prepared.

| | |
|---|---|
| Poly(methyl methacrylate) (weight average molecular weight: 140,000) | 15 g |
| Trimethylolpropane Triacrylate | 2.4 g |
| Tetraethylene Glycol Diacrylate | 6.1 g |
| Photopolymerization Initiator System | x g |
| p-Methoxyphenol | 0.01 g |
| p-Toluenesulfonamide | 1.62 g |
| Malachite Green | 0.015 g |
| Methyl Ethyl Ketone | 45 g |

Each of the coating solutions was coated on a polyethylene terephthalate film (25μ thick), then dried in a 100° C. oven for 2 minutes to form about 50μ thick coat. Each of the resulting coated supports was laminated on its coated side on a copper-clad laminate at 120° C. Then, a step wedge of 0.15 in optical density difference was superposed thereon, and the laminate structure was exposed under reduced pressure of about 10 mm Hg for 80 counts using a 2 kw super-high pressure mercury lamp (made by Orc Manuf. Co., Ltd.; jet printer). After delaminating the polyethylene terephthalate supports from the exposed laminates, the laminates were immersed in 1,1,1-trichloroethane for 60 seconds to dissolve away unexposed portions. The light sensitivities of each photopolymerizable composition was then determined by reading clear step number of the thus-obtained step wedge image.

In a second experiment, a 25μ thick polyethylene film was laminated on the unexposed coats of samples prepared as described above and coated on polyethylene terephthalate films. 10 mm × 70 mm pieces were cut out of the resulting sandwich-like laminates, and were evenly exposed for 20 counts using a 2 kw super-high pressure mercury lamp (made by Orc Manuf. Co., Ltd.; jet printer). 30 Minutes after the exposure, the polyethylene film and polyethylene terephthalate film were delaminated from the laminates to produce photo-hardened films. Each of the hardened films was mounted on a tensile tester to measure its stress-strain curve. Tensile strength of the films was evaluated in terms of yield stress with 20 count exposure.

Results thus-obtained are tabulated in Table 1.

TABLE 1

Three Compounds: 4,4'-Bis(diethylamino)benzophenone, Xanthone, Phenyltribromomethylsulfone

| Film No. | Photopolymerization Initiator System | Amount Added (× g) | Sensitivity (step) | Yield Stress (kg/cm) |
|---|---|---|---|---|
| 1 (Invention) (ternary) | 4,4'-Bis(diethylamino)benzophenone<br>Xanthone<br>Phenyltribromomethylsulfone | 0.04<br>0.16<br>0.37 | 12 | 1.20 |
| 2 (Comparison) (single compound) | 4,4'-Bis(diethylamino)benzophenone | 0.04 | No image | — |
| 3 (Comparison) (single compound) | Xanthone | 0.16 | No image | — |
| 4 (Comparison) (single compound) | Phenyltribromomethylsulfone | 0.37 | No image | — |
| 5 (Comparison) (binary) | 4,4'-Bis(diethylamino)benzophenone<br>Xanthone | 0.04<br>0.16 | 8 | 0.25 |
| 6 (Comparison) (binary) | 4,4'-Bis(diethylamino)benzophenone<br>Phenyltribromomethylsulfone | 0.04<br>0.37 | 9 | 0.51 |
| 7 (Comparison) (binary) | Xanthone<br>Phenyltribromomethylsulfone | 0.16<br>0.37 | No image | — |

As is clear from Table 1, the film sample containing the ternary polymerization initiator system in accordance with the present invention (Film No. 1) is superior to film samples using each element thereof independently (Film Nos. 2 to 4) and to film samples using binary systems thereof (Film Nos. 5 to 7) in both sensitivity and yield stress.

EXAMPLE 2

Photopolymerizable coatings were prepared, exposed and evaluated in the same manner as in Example 1 using the photopolymerization initiator systems shown in Table 2, and sensitivity and yield stress were measured as in Example 1 giving the values shown in Table 2.

In every case, the use of the ternary photopolymerization system in accordance with the present invention resulted a coat with remarkably higher sensitivity and larger yield stress than the corresponding binary system.

TABLE 2

| Film No. | Photopolymerization Initiator System | Amount Added (× g) | Sensitivity (step) | Yield Stress (kg/cm) |
|---|---|---|---|---|
| 1 (Invention) | 4,4'-Bis(diethylamino)benzophenone<br>Thioxanthone<br>Phenyltribromomethylsulfone | 0.04<br>0.17<br>0.37 | 9.5 | 0.32 |
| 2 (Comparison) | Phenyltribromomethylsulfone was | | 8 | 0.20 |

TABLE 2-continued

| Film No. | Photopolymerization Initiator System | Amount Added (× g) | Sensitivity (step) | Yield Stress (kg/cm) |
|---|---|---|---|---|
| | removed from Film No. 1. | | | |
| 3 (Invention) | 4,4'-Bis(diethylamino)benzophenone | 0.04 | | |
| | 2-Chlorothioxanthone | 0.20 | 10.5 | 0.31 |
| | Phenyltribromomethylsulfone | 0.37 | | |
| 4 (Comparison) | Phenyltribromomethylsulfone was removed from Film No. 3 | | 8 | 0.23 |
| 5 (Invention) | 4,4'-Bis(diethylamino)benzophenone | 0.04 | | |
| | 9-Fluorenone | 0.15 | 10.5 | 0.41 |
| | Phenyltribromomethylsulfone | 0.37 | | |
| 6 (Comparison) | Phenyltribromomethylsulfone was removed from Film No. 5. | | 8 | 0.13 |
| 7 (Invention) | 4,4'-Bis(diethylamino)benzophenone | 0.04 | | |
| | 2-tert-Butylanthraquinone | 0.22 | 10 | 0.79 |
| | Phenyltribromomethylsulfone | 0.37 | | |
| 8 (Comparison) | Phenyltribromomethylsulfone was removed from Film No. 7. | | 6 | 0.27 |
| 9 (Invention) | 4,4'-Bis(diethylamino)benzophenone | 0.04 | | |
| | 2-Benzoylpyridine | 0.15 | 13 | 0.43 |
| | Phenyltribromomethylsulfone | 0.37 | | |
| 10 (Comparison) | Phenyltribromomethylsulfone was removed from Film No. 9. | | 9.5 | 0.08 |
| 11 (Invention) | 4,4'-Bis(diethylamino)benzophenone | 0.04 | | |
| | 3-Benzoylpyridine | 0.15 | 13 | 0.54 |
| | Phenyltribromomethylsulfone | 0.37 | | |
| 12 (Comparison) | Phenyltribromomethylsulfone was removed from Film No. 11. | | 9.5 | 0.27 |
| 13 (Invention) | 4,4'-Bis(diethylamino)benzophenone | 0.04 | | |
| | 4-Benzoylpyridine | 0.15 | 12 | 0.75 |
| | Phenyltribromomethylsulfone | 0.37 | | |
| 14 (Comparison) | Phenyltribromomethylsulfone was removed from Film No. 13. | | 9.5 | 0.12 |

EXAMPLE 3

Preparation of a Printed-Wiring Board

Sandwich-like laminates (Film Nos. 1 to 7) were prepared according to the process described in Example 1, comprising a polyethylene terephthalate film support (25μ thick), a photopolymerizable layer (50μ thick), and a polyethylene film (25μ thick). The polyethylene film was delaminated from each of the laminates, which were then laminated at 120° C. on both sides of an affinitized and dried copper-clad laminate (having 100 each of perforations of 2.5 mm, 1.5 mm, and 1.0 mm in diameter) using an A-24 laminator. Photomasks of 3.0 mm, 2.0 mm, and 1.4 mm in land diameter were superimposed on respective laminates in alignment with the perforations, the laminates were exposed through the photomasks using a super-high pressure mercury lamp (20 counts) to produce photo-hardened resist films on both sides of the respective perforations. The polyethylene terephthalate film supports were removed from the respective laminates, and unexposed resist portions were removed by developing the laminates by spraying them with 1,1,1-trichloroethane. With the resists prepared using Film 1 of the invention and Comparison Films 5 and 6, the respective perforations were covered with photo-hardened film ("tent"). No "tent" resulted using Comparison Films 2, 3, 4 and 7. No defects were observed in any "tent". Then, the thus-developed laminates were subjected to a high pressure hot water spray (54° C.) to test the spray impact resistance of the resulting "tent". The number of "tents" destroyed during the spraying are given in Table 3.

TABLE 3

| | Tents Destroyed by Application of High-Pressure Spray (%) | | |
|---|---|---|---|
| Film No. | Perforation Diameter 2.5 mm | Perforation Diameter 1.5 mm | Perforation Diameter 1 mm |
| 1 (Invention) | 4 | 1 | 0 |
| 5 (Comparative Sample 4) | 85 | 80 | 65 |
| 6 (Comparative Sample 5) | 30 | 13 | 10 |

It is clear from Table 3 that the composition of the present invention containing the ternary photopolymerization initiator system had high sensitivity and provided tents which were substantially more durable than those given by the compositions containing a single initiator or a binary photopolymerization initiator system.

EXAMPLE 4

Preparation of a Negative-Working Presensitized Lithographic Plate

On a surface-grained and anodized 0.15 mm thick aluminum plate the following light-sensitive solution was coated using a whirler, and then dried at 100° C. for 2 minutes to prepare a presensitized plate.

| | |
|---|---|
| Trimethylolpropane Triacrylate | 0.38 g |
| Methyl Methacrylate/Methacrylic Acid (90 mols/10 mols) Copolymer (weight average molecular weight: 120,000) | 0.62 g |
| Michler's Ketone | 0.04 g |
| Xanthone | 0.02 g |
| Tribromomethylphenylsulfone | 0.02 g |

| Oil Blue #603 | 0.010 g |
| --- | --- |
| p-Methoxyphenol | 0.001 g |
| Leucocrystal Violet | 0.008 g |
| Methyl Cellosolve Acetate | 5 g |
| Methyl Ethyl Ketone | 5 g |

This presensitized lithographic plate was imagewise exposed using a 2 kw super-high pressure mercury lamp (made by Orc Manuf. Co., Ltd.; jet printer) for 20 counts, and developed with a developer composed of 1.2 g of caustic soda, 300 ml of isopropyl alcohol, and 900 ml of water to remove unexposed areas to produce a lithographic printing plate.

When the thus-obtained printing plate was printed using a printing press, 350,000 distinct copies were obtained.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising (A) an addition-polymerizable unsaturated compound having two or more ethylenically unsaturated double bonds and (B) a ternary photopolymerization initiator system comprising a combination of a 4,4'-bis(dialkylamino)-benzophenone represented by the following general formula (I), a carbonyl compound represented by the following general formula (IIb), and a compound having a group represented by the following general formula (IIc):

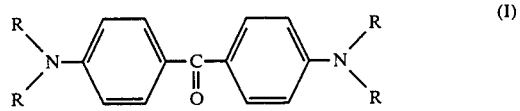
(I)

wherein each R, which is the same or different, represents an alkyl group, a cycloalkyl group or a hydroxyalkyl group, or is bonded to another R substituent of the same nitrogen atom to form a tetramethylene group, a pentamethylene group or an oxybisethylene group;

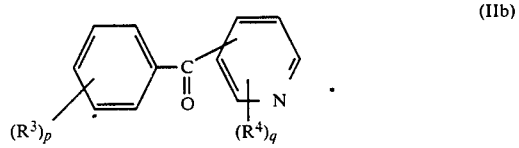
(IIb)

wherein $R^3$ and $R^4$, which is the same or different, each represents an alkyl group, an alkoxy group, a carboxy group, an alkoxycarbonyl group, an aryloxycarbonyl group, a cyano group or a halogen atom, p represents an integer of 0 to 5, and q represents an integer of 0 to 4; and $$Ar^3-SO_2CZ_3 \quad (IIIc)$$

wherein $Ar^3$ represents a substituted or unsubstituted phenyl or naphthyl group, and Z represents a chlorine atom or a bromine atom, wherein said compound of general formula (I) is present in a amount of about 0.01 to 100 parts by weight per 100 parts by weight of said addition-polymerizable unsaturated compound; said compound of general formula (IIb) is present in an amount of about 0.01 to 100 parts by weight per 100 parts by weight of said addition-polymerizable unsaturated compound; and said compound of general formula (IIIc) is present in an amount of about 0.01 to 100 parts by weight per 100 parts by weight of said addition-polymerizable unsaturated compound.

2. The photopolymerizable composition as claimed in claim 1, wherein said compound of general formula (I) is selected from the group consisting of 4,4'-bis(dimethylamino)benzophenone, 4,4'-bis(dicyclohexylamino)-benzophenone, 4,4'-bis(diethylamino)benzophenone, 4,4'-bis(dihydroxyethylamino)benzophenone, and 4,4'-bis(morpholino)benzophenone.

3. The photopolymerizable composition as claimed in claim 1, wherein said compound of general formula (IIb) is selected from the group consisting of 2-benzoylpyridine, 3-benzoylpyridine and 4-benzoylpyridine.

4. The photopolymerizable composition as claimed in claim 1, wherein said compound of general formula (IIIc) is selected from the group consisting of phenyltribromomethylsulfone, p-nitrophenyltribromomethylsulfone and p-chlorophenyltribromomethylsulfone.

5. The photopolymerizable composition as claimed in claim 1, wherein said addition-polymerizable unsaturated compound is selected from the group consisting of acrylic esters of polyols, methylacrylic esters of polyols, bisacrylamides, bismethacrylamides, polyfunctional monomers containing a urethane group or groups, acrylurethane oligomers and methacrylurethane oligomers.

6. The photopolymerizable composition as claimed in claim 5, wherein said addition-polymerizable unsaturated compound is selected from the group consisting of diethylene glycol diacrylate, diethylene glycol dimethacrylate, triethylene glycol diacrylate, triethylene glycol dimethacrylate, tetraethylene glycol diacrylate, tetraethylene glycol dimethacrylate, pentaerythritol triacrylate, pentaerythritol trimethacrylate, trimethylolpropane triacrylate, trimethylolpropane trimethacrylate, dipentaerythritol hexaacrylate, dipentaerythritol hexamethacrylate, 1,6-hexanediol diacrylate, 1,6-hexanediol dimethacrylate, methylenebisacrylamide, methylenebismethacrylamide, ethylenebisacrylamide, ethylenebismethacrylamide, di(2-methacryloxyethyl)-2,4-tolylenediurethane, and di(2-acryloxyethyl)hexamethylenediurethane.

7. The photopolymerizable composition as claimed in claim 1, wherein said compound of general formula (I) is present in a range of about 0.1 to 50 parts by weight per 100 parts by weight of said addition-polymerizable unsaturated compound; said compound of general formula (IIb) is present in an amount of about 0.1 to 50 parts by weight per 100 parts by weight of said addition-polymerizable unsaturated compound; and said compound of general formula (IIIc) is present in an amount of from about 0.1 to 50 parts by weight per 100 parts of said addition-polymerizable unsaturated compound.

* * * * *